United States Patent [19]

Hosokawa et al.

[11] Patent Number: 5,382,344
[45] Date of Patent: Jan. 17, 1995

[54] SPUTTERING APPARATUS

[75] Inventors: Naokichi Hosokawa; Kyungshik Kim, both of Fuchu, Japan

[73] Assignee: Anelva Corporation, Tokyo, Japan

[21] Appl. No.: 274,377

[22] Filed: Jul. 13, 1994

Related U.S. Application Data

[63] Continuation of Ser. No. 917,185, Jul. 22, 1992, abandoned.

[30] Foreign Application Priority Data

Aug. 2, 1991 [JP] Japan .................. 3-194298

[51] Int. Cl.$^6$ .................. C23C 14/35
[52] U.S. Cl. .................. 204/298.2; 204/298.19; 204/298.23
[58] Field of Search .......... 204/298.19, 298.2, 298.23

[56] References Cited

U.S. PATENT DOCUMENTS

| | | | |
|---|---|---|---|
| 3,965,093 | 5/1976 | McLeod | 204/192.12 |
| 4,094,761 | 6/1978 | Wilson | 204/192.2 |
| 4,116,791 | 9/1978 | Zega | 427/524 |
| 4,392,939 | 7/1983 | Crombeen et al. | 204/298.19 |
| 4,407,713 | 10/1983 | Zega | 204/298.22 |
| 4,437,966 | 3/1984 | Hope et al. | 204/298.29 |
| 4,600,492 | 7/1986 | Ooshio et al. | 204/298.2 |
| 5,196,105 | 3/1993 | Feuerstein et al. | 204/298.19 |

FOREIGN PATENT DOCUMENTS

| | | | |
|---|---|---|---|
| 53-7586 | 1/1978 | Japan | 204/298.2 |
| 55-27627 | 7/1980 | Japan | 204/298.21 |
| 59-190364 | 10/1984 | Japan | 204/289.19 |
| 63-103066 | 5/1988 | Japan | 204/298.19 |
| 63-65754 | 12/1988 | Japan | 204/298.19 |
| 3-6372 | 1/1991 | Japan | 204/298.2 |
| 3-82759 | 4/1991 | Japan | 204/298.19 |
| 3-51788 | 8/1991 | Japan | 204/298.19 |
| 4-358064 | 12/1992 | Japan | 204/289.19 |
| 5-25626 | 2/1993 | Japan | 204/298.19 |

OTHER PUBLICATIONS

"Cylindrical Magnetron Sputtering", Thornton et al, 1978 Academic Press,Inc.; pp. 75–113.
"Thin Film Handbook", pp. 186–189.
"Dry Process application Technology", pp. 63–64.

Primary Examiner—Aaron Weisstuch
Attorney, Agent, or Firm—Fay, Sharpe, Beall, Fagan, Minnich & McKee

[57] ABSTRACT

At least one magnetron cathode provided in a sputtering apparatus comprises a magnet assembly in which first and second types of magnet units whose N and S poles are oppositely disposed are alternately disposed adjacent to each other. Two types of loop loci in which drift electron motions are directed in the opposite directions are alternately formed adjacent to each other by said first and second magnet units on a surface of the target. Consequently, a hybrid orbit is formed, and an ion current generation region is enlarged. Furthermore, a moving mechanism for reciprocating the magnet assembly is provided in the magnetron cathode. The above configuration solves the problem involving generation of non-uniform ion bombardment of the target, and achieves a magnetron sputtering electrode capable of depositing a thin film on a relatively large rectangular substrate in a stationary state without moving the substrate. Thus, reduction in the size of the apparatus, waste of the rectangular target due to non-uniform erosion, heterogeneity of the thin film on the substrate, and reduction of generation of dust particles can be obtained.

15 Claims, 16 Drawing Sheets

SPUTTERING APPARATUS

This is a continuation application of Ser. No. 07/917,185, filed Jul. 22, 1992, now abandoned.

BACKGROUND OF THE INVENTION

1. Field of the Invention

The present invention relates to a sputtering apparatus, and more particularly, to a sputtering apparatus having a cathode capable of depositing a homogeneous thin film of a uniform thickness on the surface of a relatively large substrate while effectively consuming the entirety of a target surface.

2. Description of the Related Art

In conventional sputtering apparatus, various types of cathode structures have been proposed. Among them, the magnetron cathode type is most widely applied to industrial fabrication processes because of its high deposition rate. Various types of magnetron cathode types are known. Such magnetron cathode types are described in, for example, "Thin Film Process" (published by Academic Press in 1978 and edited by J. L. Vossen and W. Kern from pages 75 to 113) or in "Thin Film Handbook" (published in 1983 and edited by Nippon Gakujutsu Shinkokai Thin Film 131st Committee page 186 to 189).

Of the magnetron cathode types, the planar magnetron cathode provided with a planar target is currently the most advantageous from the viewpoint of industrial fabrication.

In conventional sputtering apparatus to which a planar magnetron cathode having a rectangular planar shape is applied, the following problems (1) through (4) arise with deposition of a thin film on a large area substrate:

(1) Increase in the size of the apparatus
(2) Waste of target due to non-uniform erosion thereof
(3) Heterogeneity of the film deposited on a substrate due to non-uniform ion bombardment and non-uniformity of plasma space density distribution above the surface of the target
(4) Generation of dust particles due to non-uniform ion bombardment of the surface of the target Each of the above problems (1) through (4) will be described in detail below.

(1) Increase in the size of the apparatus:

The relative spatial relationship between the substrate and the target in the sputtering apparatus has been described in, for example, "Dry Process Application Technology" (written by Haruhiro Kobayashi, Takashi Okada and Naokichi Hosokawa and published by Nikkan Kogyo Shinbun Shuppan in 1984), pages 63 to 64. Normally, a thin film is deposited on a large substrate by the "substrate transferring" method. The "substrate transferring" method is a method of depositing a thin film on the surface of a substrate by sputtering in a sputtering apparatus in which a rectangular target is disposed while transferring (i.e. moving) the substrate along a plane parallel to the surface of the rectangular target. Japanese Patent Publication No. 63-65754 (Japanese Patent Laid-Open No. 60-86272) discloses a substrate transferring type sputtering apparatus in which a rectangular magnetron cathode is incorporated. In this substrate transferring type sputtering apparatus, the direction of substrate movement is parallel to the shorter side of the rectangular target in order to deposit a thin film having a uniform thickness.

When the dimensions of the substrate are larger than the length of the shorter side of the target, the deposition of a thin film having a uniform thickness on the substrate generally requires moving the substrate a sufficiently long distance during film deposition. This requirement, concomitant with a requirement for increase in productivity, increases the scale of the substrate transferring type sputtering apparatus for larger substrates.

In, for example, a sputtering apparatus marketed by the ANELVA Corporation, a magnetron cathode having a planar target whose shorter and longer sides are respectively 250 mm and 864 mm in length and a tray having a height of 950 mm and a width of 830 mm are employed to transport a glass substrate having a height of 700 mm and a width of 680 mm, to deposit a thin film having a uniform thickness within a tolerance of ±10% (ANELVA "3960S").

This sputtering apparatus further requires (i) a load-lock mechanism for transporting from the atmospheric side an unprocessed substrate into a deposition chamber where the sputtering process is performed and for transporting the processed substrate back out to the atmospheric side from the deposition chamber while maintaining and controlling the deposition chamber under a vacuum, (ii) a heating zone for heating the substrate prior to the deposition and (iii) a buffering space required to convey trays substantially successively, and thus has a height of about 2.5 m, a width of about 2 m and an overall length of 10 to 20 m. Finally, this is a huge system.

(2) Waste of target due to non-uniform erosion thereof;

As has been described in the aforementioned literature, in the magnetron cathode, since the target surface thereof is subjected to non-uniform ion bombardment, it is eroded non-uniformly. This non-uniform erosion occurs due to utilization of a non-uniform magnetic field generated around the target surface in the magnetron cathode.

For example, in both the conventional cylindrical coaxial magnetron cathode and conventional circular planar magnetron cathode, a structure for displacing a magnet assembly provided within the cathode is provided to improve target waste and film thickness distribution caused by non-uniform erosion of the target (Japanese Patent Publication No. 55-27627 and Japanese Patent Laid-Open No. 3-6372). This structure is suitable for an electrode having a rotationally symmetrical structure. According to this structure, it is possible to make erosion across the target uniform in a circular planar magnetron cathode by rotating the magnet assembly around an axis. However, this structure is not effective as a means for making erosion across a planar rectangular target uniform.

(3) Heterogeneity of the deposited film on the substrate:

Non-uniform ion bombardment on the target surface of the magnetron cathode also causes heterogeneity of the film deposited over the whole substrate. This influence of the non-uniform ion bombardment will be described below with reference to the structure described in the aforementioned Japanese Patent Publication No. 63-65754 (Japanese Patent Laid-Open No. 60-86272). This structure provides for the deposition of a thin film by a combination of a rectangular magnetron cathode and a substrate transferring type sputtering apparatus.

When a magnetron plasma is generated in a vacuum by applying a voltage between the cathode and the wall of a vacuum vessel acting as an anode to deposit a thin film by sputtering, electrons perform drift-motion along a closed tunnel path generated by the lines of magnetic force over the surface of the planar target of the rectangular magnetron cathode and make a looped locus. Since the drift electrons collide with the gas molecules to create ions and additional electrons, a plasma of a high density is generated along the locus of the drift electrons. The portion of the target surface located right below the locus of the drift electrons is subjected to strong ion bombardment and is thereby sputtered. In an actual apparatus, since a very large number of drift electrons are present, the locus thereof has a belt-like shape having a certain width. Thus, the plasma generated along this belt also becomes belt-like. The region on the target surface which is sputtered, called an erosion region, is also a loop region having a belt-like shape.

The substrate placed on a conveyed tray passes through the space in front of the target during the film deposition. At that time, a certain portion on the substrate passes across the space located above the two belt-like erosion regions which run parallel to the longer side of the rectangular target. The space located above these two erosion regions has a high plasma density. As is well known, particles (atoms) which are sputtered are ejected in all directions as well as in the direction perpendicular to the target surface. Thus, at certain positions (i.e. portions) of the substrate, accumulation of the sputtered particles (atoms) starts before the portion arrives at the belt-like erosion regions. The deposition rate increases as the portion on the substrate approaches the space above the first belt-like erosion region. The deposition rate is at a maximum right above the first belt-like erosion region. Thereafter, the deposition rate on the portion on the substrate temporarily decreases as the tray moves away from the first belt-like erosion region. The deposition rate increases again as the portion on the substrate approaches the space above the second belt-like erosion region, and it achieves the maximum deposition rate again when the portion on the substrate is directly right above the second belt-like erosion region. This is the second time the maximum deposition rate occurs. During subsequent conveyance of the tray, the deposition rate on the portion on the substrate gradually decreases as the substrate moves away from the space in front of the target.

Thus, the film deposition rate of the certain portion of the substrate varies with time. Also, the angle of incidence of the sputtered atoms accumulated on the surface of the substrate and the plasma density in the space above the surface of the substrate respectively vary greatly with time. These factors result in changes of the physical characteristics of the final thin film formed at each position of the substrate surface in the direction perpendicular to the film surface.

(4) Generation of dust particles:

Non-uniformity of ion bombardment on the target surface of the magnetron cathode causes generation of dust particles during the film deposition process. As mentioned above, on the target surface of the rectangular magnetron cathode, a single closed belt-like erosion region, which is narrow as compared with the width of the target, is subjected to ion bombardment and is eroded. The other regions of the target surface are not eroded: rather, atoms ejected from the target and scattered by collision with the gas molecules are deposited thereon. After sputtering continues for a long time, sputtered particles (atoms) are deposited on that portion of the target surface other than the belt-like erosion regions. The film deposited on the target begins to peel off the target surface due to the internal stress of the film as the film thickness increases and bits of the peeled off film become dust particles. In electronic devices manufactured by processing fine patterns of the thin film on the substrate, generation of dust particles is regarded as one of the reasons for the increase of defects in products. Hence, development of a magnetron cathode electrode which can reduce the generation of dust particles has been desired.

SUMMARY OF THE INVENTION

An object of the present invention is to provide a sputtering apparatus, which has a cathode structure capable of overcoming the problems involving non-uniform ion bombardment of a target and, of depositing a thin film on a relatively large rectangular substrate while the substrate remains at rest, and which enables the overall size of the apparatus to be reduced.

Another object of the present invention is to provide a sputtering apparatus having a cathode structure which is capable of solving the problems involving waste of a rectangular target, heterogeneity of a thin film deposited on the substrate, and generation of dust particles due to non-uniform erosion.

To achieve the above-mentioned objects, the present invention provides a sputtering apparatus which includes a vacuum vessel having an evacuation system, a substrate holding member disposed within the vacuum vessel for mounting a substrate on which a film is to be deposited, at least one magnetron cathode disposed in opposed relation to the substrate holding means and having a rectangular planar target used to deposit a film on a surface of the substrate, a gas control system for supplying a gas into the interior of the vacuum vessel and thereby maintaining the inner pressure thereof at an adequate value, and a power source system for supplying electric power to the magnetron cathode. The single magnetron cathode includes a magnet assembly in which first and second types of magnet units whose magnetic poles N and S are oppositely disposed are alternately disposed adjacent to each other. Two types of looped loci in which drift electron motions are directed in opposite directions are alternately formed adjacent to each other on a surface of the target by the first and second magnet units. Alternate formation of the looped loci in which drift electron motions are directed in opposite rotational directions close to each other forms a region in which drift electron motions are directed in the same direction in the adjoining region. Thus, a hybrid drift electron orbit is formed in the region adjoining each other by the two looped drift electron orbits.

In the preferred form of the magnet assembly of the aforementioned structure, the first and second types of magnet units whose magnetic Poles N and S are oppositely disposed are positioned close enough to each other to form a common ion current generation (a hybrid drift electron orbit) region by coupling two ion current generation regions respectively produced by the first and second types of magnet units.

In the preferred form of the aforementioned structure, the magnetron cathode has a moving mechanism for reciprocating the magnet assembly. The looped lock are made reciprocatively movable as a consequence of the reciprocating motion of the magnet assembly.

In the preferred form of the aforementioned structure, each of the first and second magnet units comprises a yoke, a central magnet disposed on the yoke, and a peripheral magnet disposed on the yoke around the central magnet. Each of the central magnet and the peripheral magnet has magnetic pole surfaces parallel to the target surface on the sides thereof located close to the yoke and remote from the yoke.

In the preferred form of the aforementioned structure, a spacer having a relatively narrow width is disposed between the adjacent magnet units so as to allow the spacing between the first and second magnet units to be reduced as close as possible.

In a modification of the magnet unit, each of the first and second magnet units comprises a yoke and a looped magnet disposed on the yoke, The looped magnet has magnetic pole surfaces perpendicular to the target surface on inner and outer peripheral surfaces thereof.

In the aforementioned modification of the magnet unit, the looped magnets of the adjoining magnet units are in contact with each other. In this modification, the spacing between the first and second magnet unit can be minimized.

In the sputtering apparatus according to the present invention, the magnet assembly is disposed in a fixed state in a recessed space formed in an electrode housing of the magnetron cathode.

In the preferred form of the aforementioned structure, the magnet assembly is disposed in the recessed space formed in the electrode housing of the magnetron cathode with a space provided where the magnet assembly can move. The magnet assembly is reciprocatively movable within the recessed space.

In the sputtering apparatus according to the present invention, the substrate holding member is movable for conveying the substrate. The substrate holding member remains at rest at a position where the substrate opposes the target surface of the magnetron cathode when a thin film is deposited on the substrate.

In the preferred form of the aforementioned structure, the moving mechanism for the magnet assembly includes a rotary driving device, a converting mechanism for converting a rotational motion of the rotary driving device into a reciprocating motion of the magnet assembly, and a guide member for guiding the reciprocating motion of the magnet assembly.

In the sputtering apparatus according to the present invention, the drift electron motions on the adjoining two drift electron orbits in the adjoining two looped loci are directed in the same direction and parallel to each other.

Particularly, the adjoining two drift electron orbits are hybridized to form a single hybrid orbit, and ion current generation regions generated by the drift electrons on the two looped loci are coupled to each other. Thus, the ion current generation region generated in the hybridized state is wider in terms of an erosion region on the target surface than the ion current generation region obtained by algebric sum of the ion current generation regions generated by the two drift electron orbits.

According to the present invention, regarding the magnet assembly provided in the magnetron cathode having the rectangular planar target and including a plurality of magnet units, selection and layout of the magnetic poles of the plurality of magnet units are determined such that the ion current generation regions are coupled to each other in the manner described above. Consequently, the looped loci representative of the plurality of drift electron motions can be disposed effectively on the target surface, and the adjoining drift electron orbits are thereby hybridized to form a wider drift electron orbit. The target surface can be efficiently eroded by the wider drift electron orbit generated by hybridization. Also, since the closely disposed adjacent drift electron orbits are hybridized without repulsion, magnetron plasma can be stably maintained on the target surface without uneven distribution.

Furthermore, since the plurality of magnet units can be disposed close to each other by adequately selecting the layout and form of the magnet or provision of the spacer, the overall size of the magnet assembly can be reduced.

In the magnetron cathode having the small magnet assembly and the moving mechanism, the magnet assembly can be vibrated substantially parallel to the surface of the rectangular planar target within an inner space of the magnetron cathode. When the stroke of the reciprocating motion is equal to, for example, the width of a single magnet unit, the eroded region of the target can be made uniform.

The difference between the cathode structure disclosed in the aforementioned Japanese Patent Publication No. 63-65754 and the cathode structure according to the present invention will be described below.

In the cathode disclosed in the above-mentioned Japanese Patent literature, a single cathode electrode has a single magnet unit, and a single loop locus for the drift electrons is formed in the single cathode. A plurality of such cathodes are disposed so that the motions of the loop loci of the adjacent cathodes are directed in the opposite directions to form the electron orbit portions directed in the same direction. The cathode of this sputtering apparatus is suitable for forming a thin film on a substrate while moving the substrate.

In the present invention, a single cathode has a plurality of magnet units, and the magnet units whose magnetic poles are oppositely disposed are alternately disposed to form a plurality of loop drift electron loci. In the single cathode, the loop loci directed in the opposite directions are alternately formed, and the electron orbit portion directed in the same direction is formed in an adjoining region between the loop loci. Particularly, in the present invention, the magnet units are alternately disposed so that the electron orbit portions directed in the same direction are hybridized to form a single hybrid orbit such that the ion current generation regions generated by the two electron orbits are coupled to each other. Formation of the plurality of drift motion loci on the single cathode is effective to form a thin film having a uniform thickness on the substrate which remains at rest in an opposed relation to the large cathode and to enhance the efficiency with which the target is used.

DETAILED DESCRIPTION OF THE PREFERRED EMBODIMENTS

Embodiments of the present invention will be described below with reference to FIGS. 1 through 30.

Figure 1:
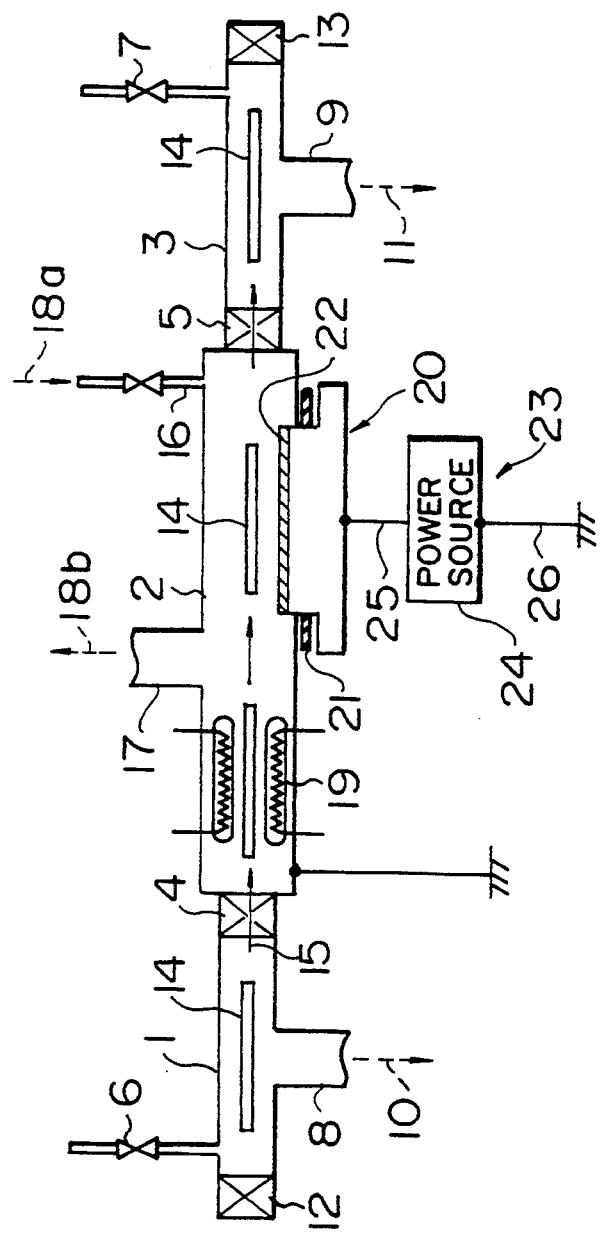
FIG. 1 is a cross-sectional view of an example of a sputtering apparatus according to the present invention.

Referring first to FIG. 1, a sputtering apparatus includes a substrate tray loading chamber 1, a sputtering chamber 2 where a thin film is deposited on the surface of a substrate mounted on a tray, and a substrate tray unloading chamber 3, The substrate tray loading chamber 1, the sputtering chamber 2, and the substrate tray unloading chamber 3 are series connected to each other. Each of these chambers forms a vacuum vessel which can be evacuated independently of each other so that it can be maintained or controlled under a vacuum. A gate valve 4 is provided between the substrate tray loading chamber 1 and the sputtering chamber 2, and a gate valve 5 is provided between the sputtering chamber 2 and the substrate tray unloading chamber 3.

The sputtering chamber 2 is normally maintained and controlled under a vacuum. Pressure within the substrate tray loading chamber 1 can be increased up to atmospheric pressure by opening a leak valve 6. Also, pressure within the substrate tray unloading chamber 3 can be increased up to the atmosphere pressure by opening a leak valve 7. The substrate tray loading chamber 1 is evacuated via evacuation pipe 8 in a direction indicated by arrow 10 by a vacuum pump (not shown). The substrate tray unloading chamber 1 is evacuated via evacuation pipe 9 in a direction indicated by arrow 11 by a vacuum pump (not shown). At the left end of the substrate tray loading chamber 1 as viewed in FIG. 1 there is provided an inlet door 12. At the right end of the substrate tray unloading chamber 3 as viewed in FIG. 1 there is provided an outlet door 13.

A tray 14 with a substrate mounted thereon is carried into the substrate tray loading chamber 1 from the inlet door 12. The tray 14 is a means for holding the substrate. A relatively large substrate is used. After the tray with the substrate thereon has been carried into the substrate tray loading chamber 1, the inlet door 12 and the gate valve 4 are closed and the substrate tray loading chamber 1 is evacuated by the evacuation system. When the internal pressure of the substrate tray loading chamber 1 has attained a predetermined low pressure, the gate valve 4 is opened, and then the tray 14 is conveyed along a rail (not shown) in a direction indicated by arrow 15 into the sputtering chamber 2.

In the sputtering chamber 2, a thin film is deposited by sputtering onto the surface of the substrate placed on the tray 14. During the film deposition on the substrate, the tray 14 remains at rest. After the thin film has been formed on the substrate, the tray 14 is sent into the substrate tray unloading chamber 3 via the gate valve 5. After the tray 14 has been sent into the substrate tray unloading chamber 3, the gate valve 5 is closed, and then the leak valve 7 is opened, whereby the substrate mounted on the tray 14 is placed under an atmospheric environment. Thereafter, the outlet door 13 is opened to take the tray 14 out.

In the sputtering chamber 2, a gas is introduced via a gas introducing pipe 16 in a direction indicated by arrow 18a from a cylinder (not shown). Also, the sputtering chamber 2 is evacuated in a direction indicated by arrow 18b via an exhaust port 17 by a vacuum pump (not shown). Thus, in a state where the introduced gas flow rate is balanced with the exhaust gas flow rate, the sputtering chamber 2 is maintained under a fixed pressure ranging from $10^{-3}$ to $10^{-2}$ Torr, which is suitable for sputtering.

Inside the sputtering chamber 2 near the inlet thereof, a substrate heating lamp 19 is provided if necessary. The substrate heating lamp 19 radiates heat and thereby the temperature of the substrate, which is to be subjected to a thin film formation process rises. At the rear stage of the sputtering chamber 2, a magnetron cathode 20 (hereinafter referred to as "a cathode" 20) having a large rectangular planar target is disposed with an insulator 21 between the sputtering chamber 2 and the cathode 20. A target assembly 22 is mounted on the upper surface of the cathode 20. The upper surface of the target assembly 22 as viewed in FIG. 1 forms a target surface. A power source system 23, comprising a power source 24, a power supply line 25 extending between the cathode and the power source, and a connection line 26 extending between the power source and an earth, is connected to the cathode 20 to supply power to the cathode 20.

In the sputtering chamber 2, the tray 14 remains at rest relative to the cathode 20. In that stationary state, the substrate on the tray 14 opposes the target surface. On the opposed surface of the substrate, particles (atoms) sputtered (ejected) from the target assembly 22 are deposited to form a thin film. In FIG. 1, a combination of a single tray 14 and a single cathode 20 is illustrated. However, a desired number of cathodes 20 may be provided in the sputtering chamber 2. The wall portion of the sputtering chamber 2 is grounded.

Figure 2:
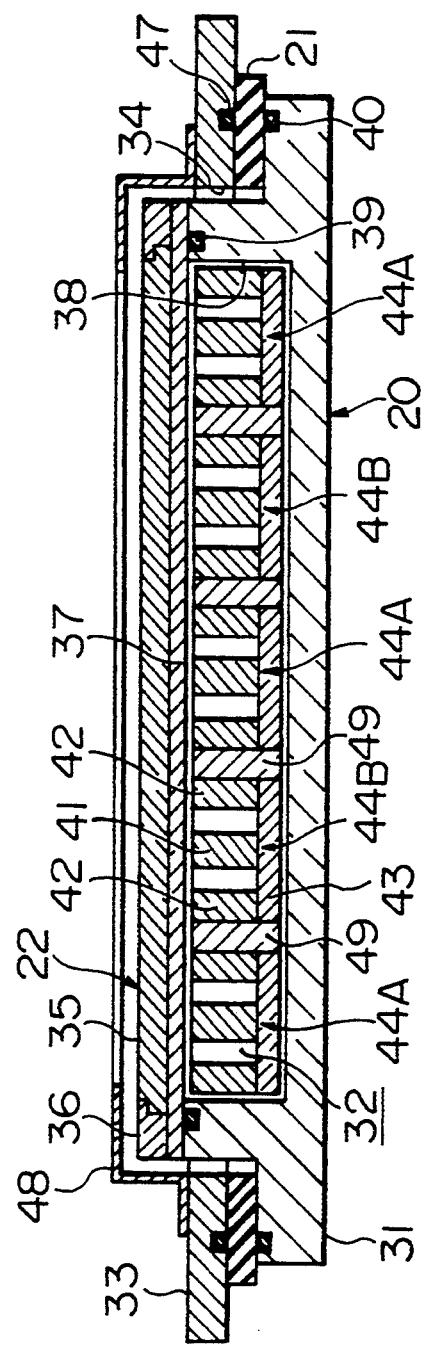
FIG. 2 is a cross-sectional view of a first embodiment of a magnetron cathode according to the present invention.

The structure of the cathode 20 will be described below with reference to FIG. 2. The cathode 20 comprises an electrode housing 31, a magnet assembly 32 disposed inside the electrode housing 31, and a target assembly 22. Reference numeral 33 denotes part of a wall portion of the sputtering chamber 2. The cathode 20 is mounted in an opening 34 formed in the wall portion 33 with the insulator 21 therebetween. The cathode 20 is mounted in the open portion 34 in such a manner that the target surface of the target assembly 22 is exposed in the vacuum chamber. Illustration of a fixture and a clamping mechanism required for mounting is omitted.

The target assembly 22 includes a target plate 35, a target pressing jig 36 and a target backing plate 37. The target assembly 22 is fixed to the electrode housing 31 by means of a coupling member (not shown).

Figure 3:
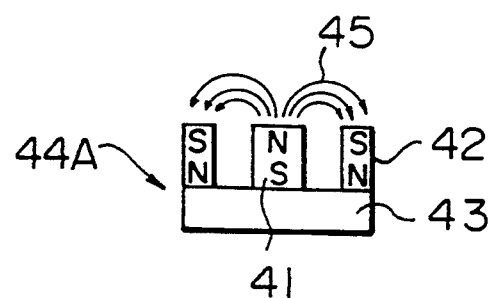
FIG. 3 is a cross-sectional view of a first magnet unit.
Figure 4:
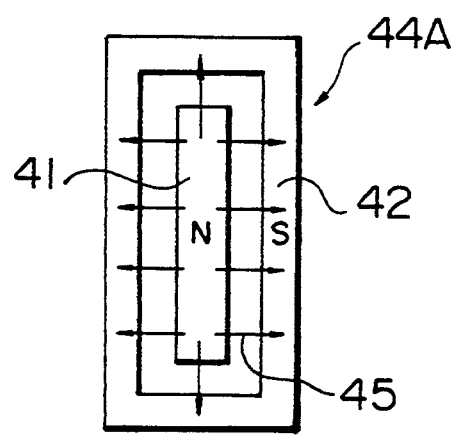
FIG. 4 is a plan view of the first magnet unit.
Figure 5:
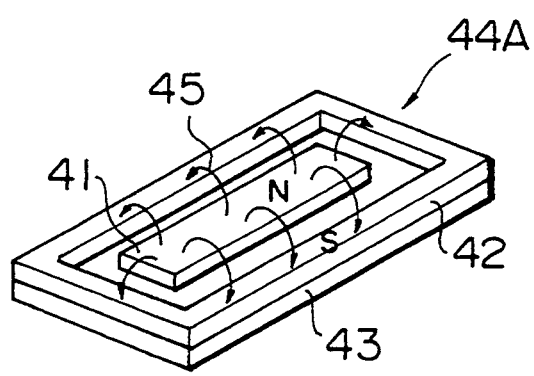
FIG. 5 is an external perspective view of the first magnet unit.
Figure 8:
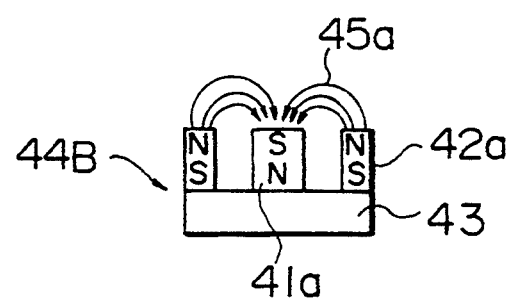
FIG. 8 is a cross-sectional view of a second magnet unit.

The aforementioned magnet assembly 32 is disposed in a recessed space 38 formed in the electrode housing 31. Practically speaking, for example, five magnet units, each of which comprises a central magnet 41, a peripheral magnet 42 and a yoke 43, are disposed in the recessed space 38. These five magnet units constitute the magnet assembly 32. The five magnet units are classified into two types 44A and 44B whose magnetic poles are disposed in opposed sides, as shown in FIGS. 3 and 8. Due to the arrangement of the magnetic poles of the magnet units 44A and 44B in the opposite dispositions, the directions of the loci of the drift electrons generated by these two types oppose each other. The magnet units 44A and 44B will be described in detail later. A shunt spacer 49 is disposed between the adjacent magnet units. There are four shunt spacers 49 in total. Thus, in this example, the magnet assembly 32 is composed of the five magnet units (44A and 44B) and the four shunt spacers 49.

Although not shown, cooling water is introduced into the electrode housing 31 from an external source. The cooling water is in contact with the target backing plate 37 to cool it. Thus, the heat generated on the target surface of the target assembly 22 during magnetron plasma is removed through the medium of the cooling water.

An O ring 39 is disposed between the electrode housing 31 and the target backing plate 37 to obtain air tightness. Air tightness between the electrode housing 31 and the insulator 21 is provided by an O ring 40, and air tightness between the insulator 21 and the wall portion 33 of the vacuum vessel is obtained by an O ring 47.

The whole cathode surface should not be ion-bombarded but only the desired target surface should be bombarded and sputtered. To prevent such portions from being ion bombarded, a shielding member 48 is disposed on the peripheral portion of the open portion 34 and on the inner surface of the wall portion 33.

With reference now to FIGS. 3 through 6, the magnet unit 44A of the magnet assembly 32 will be described in detail below The magnet unit 44A includes the substantially rectangular yoke 43, and the plate-shaped central magnet 41 and the rectangular looped peripheral magnet 42 which are disposed on the yoke 43.

In the magnet unit 44A, the central magnet 41 is disposed so that the S pole thereof is close to the yoke 43 while the N pole thereof is remote from the yoke 43. The peripheral magnet 42 is located so that the N pole thereof is close to the yoke 43 while the S pole thereof is remote from the yoke 43. Such a layout of the magnetic poles produces lines of magnetic force 45 which are directed from the central magnet 41 towards the peripheral magnet 42. The number of lines of magnetic force shown in FIGS. 3 through 5 seems to be finite at a glance, but, in practice, the number of lines of magnetic force is infinite. In the portion of the cathode 20 where the magnet unit 44A is provided, lines of magnetic force coming from the center of the target surface and entering the periphery thereof are generated. Such lines of magnetic force form a loop closed tunnel path.

When an electrically negative high potential is applied to the cathode 20 in a state where the lines of magnetic force are generated, an electric field is generated perpendicular to the target surface. A combination of this electric field perpendicular to the target surface and the magnetic field which forms the tunnel path produces drift motion of electrons along the tunnel path on the target surface. The locus of the drift motion of the electrons is a looped line, resulting in generation of a low-voltage and large-current discharge which is utilized to deposit a film on the substrate at a high rate.

Figure 6:
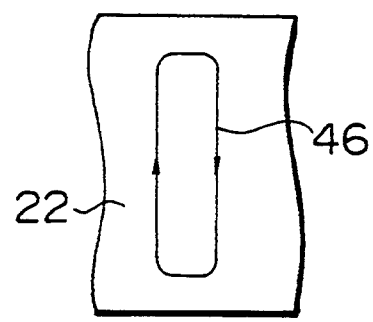
FIG. 6 illustrates a loop locus on a target surface formed by the first magnet unit.

FIG. 6 illustrates the locus of drift motion of the electrons which is formed on the target surface on the basis of the lines of magnetic force 45 generated by the magnet unit 44A. The drift electrons move along a loop locus 46 in the circulating direction indicated by arrows. Although the loop locus 46 is indicated as a closed line in FIG. 6, in practice it has a closed belt-like shape.

Figure 7:
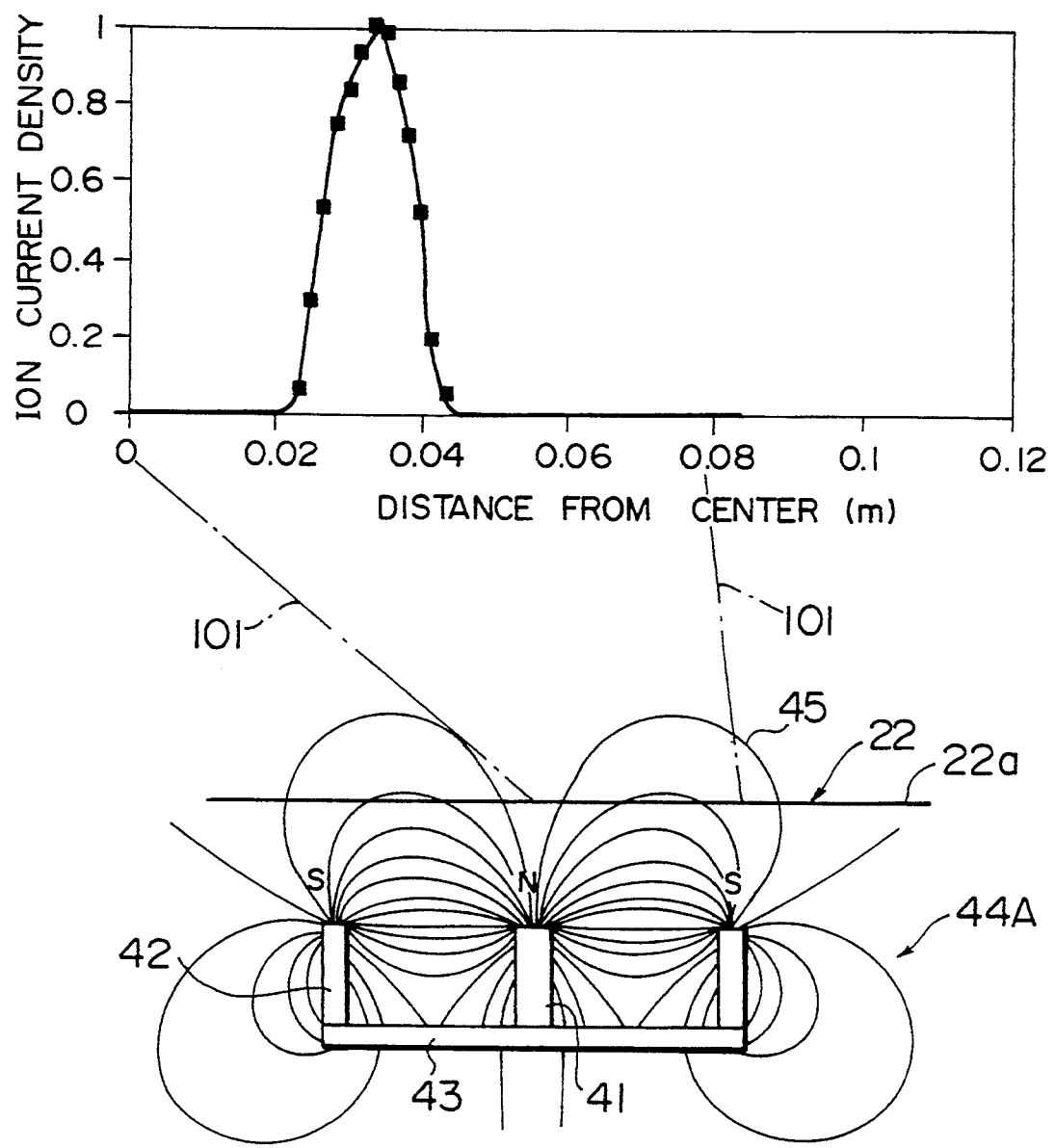
FIG. 7 illustrates the distribution of lines of magnetic force by the first magnet unit and a graph showing an ion current density distribution above the target surface by the first magnet unit.

The lines of magnetic force 45, the locus of the drift motion of the electrons, and the eroded area on the target will be described in detail with reference to FIG. 7. FIG. 7 shows the cross-section of the magnet unit 44A and distribution of the lines of magnetic force, together with distribution of the ion current density on the target surface. In FIG. 7, as to the cross-section of the magnet unit 44A, the abscissa represents the widthwise position of the magnet unit 44A. Thus, in FIG. 7, the widthwise position of the magnet unit 44A and the distribution of the ion current density have a positional relationship indicated by alternate long and short dashed lines 101. The dimensions of the magnet unit shown in FIG. 7 may be 11 cm in width and 3.3 cm in height. A target surface 22a of the target assembly 22 is set at a position spaced from the magnetic pole surface of the magnet unit 44A by 3.3 cm.

Ions are generated as a consequence of collision of the drift electrons with gas molecules. Thus, the distribution of the ion current density shown in FIG. 7 can be regarded as a projection of the space density of the drift electrons which pass the space located above the target surface 22a onto the target surface. The locus of the drift electrons is not a single line but a space having a width defined by a probability distribution. The loci of the drift electrons are formed on a region having a width of about 2.1 cm between the distances of 2.1 cm and 4.2 cm from the center in the widthwise direction of the magnet unit 44A. In this region, ion current is generated by the drift electrons. At a position spaced from the center of the magnet unit 44A by 3.4 cm, the probability of the current density is at a maximum. The looped locus 46 shown in FIG. 6 indicates the position of the maximum probability. In the distribution of the ion current density shown in FIG. 7, on the opposite symmetrical portion with respect to a center 0 (not shown) corresponding to the portion shown in FIG. 7, ion current density distribution having a specular symmetrical shape is generated also. Since ions bombard the target and thereby sputter it, ion current density distribution corresponds to the erosion depth across the target.

Figure 9:
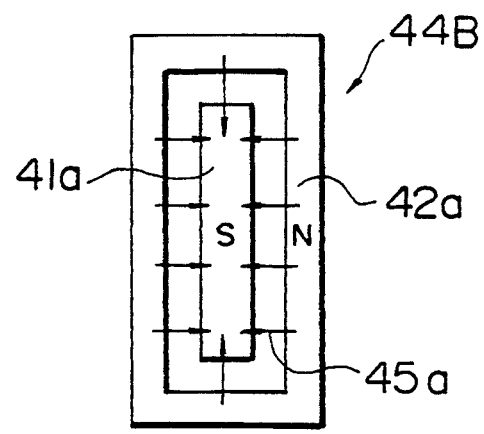
FIG. 9 is a plan view of the second magnet unit.
Figure 10:
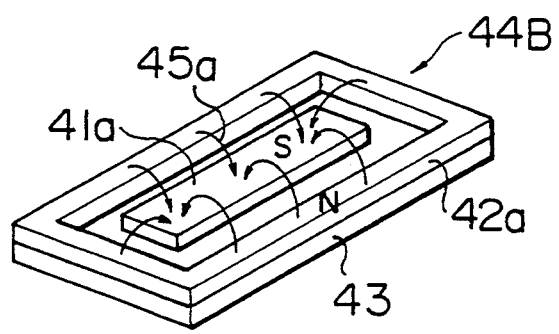
FIG. 10 is an external perspective view of the second magnet unit.
Figure 11:
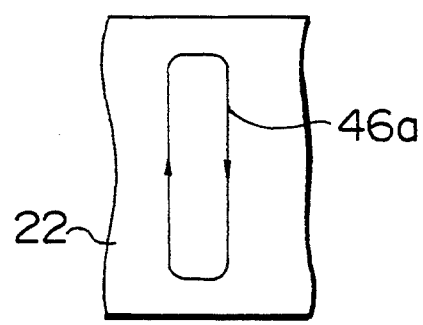
FIG. 11 illustrates a looped locus on the target surface formed by the second magnet unit.

The magnet unit 44B will now be described with reference to FIGS. 8 through 11. The magnet unit 44B basically includes the same components as those of the magnet unit 44A shown in FIGS. 3 through 5. The difference between the magnet unit 44A and 44B, however, lies in the fact that central magnet 41a and peripheral magnet 42a are disposed so that the magnetic poles thereof are opposite to those of the central magnet 41 and the peripheral magnet 42. Consequently, as shown in FIGS. 8 through 10, lines 45a of magnetic force are formed from the peripheral magnet 42a toward the central magnet 41a. Thus, application of an electrically negative high potential to the cathode 20 produces drift motion of the electrons On the target surface due to the action of a combination of the electric field and the magnetic field. In this case, the locus of the electron drift motion is a loop locus directed in the opposite direction to that of the case of the magnet unit 44A, as shown in FIG. 11. The drift electrons move along that loop locus 46a.

The detailed lines of magnetic force and ion current density distribution of the magnet unit 44B described in FIGS. 8 through 11 are the same as those shown in FIG. 7 with the exception that the magnetic poles are opposite.

Figure 12:
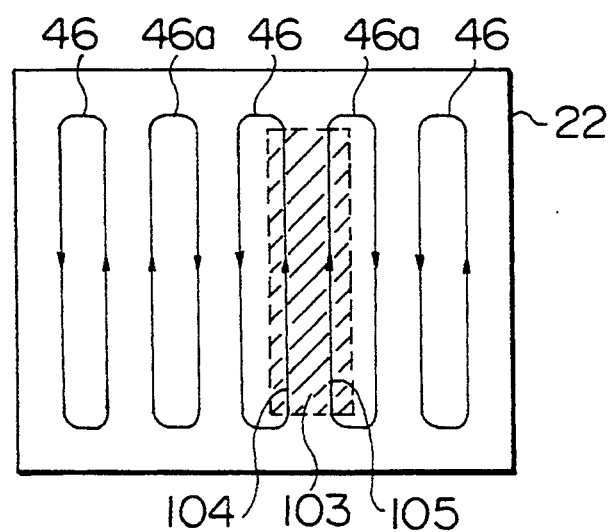
FIG. 12 illustrates the looped loci on the target surface by the magnetron cathode according to the first embodiment of the present invention.

The magnet units 44A and 44B in which the drift direction of the electrons are opposed each other have now been described. In the magnet assembly 32 of the cathode 20, such magnet units 44A and 44B are alternately disposed with the shunt spacer 49 therebetween. FIG. 12 illustrates five loop drift electron loci formed on the target surface by the five magnet units provided in the magnet assembly 32. In FIG. 12, the first, third, and fifth loop loci 46 from the left are the magnet units 44A, while the second and fourth loop loci 46a are the magnet units 44B. The loop loci 46 and 46a are thus alternately formed.

Figure 13:
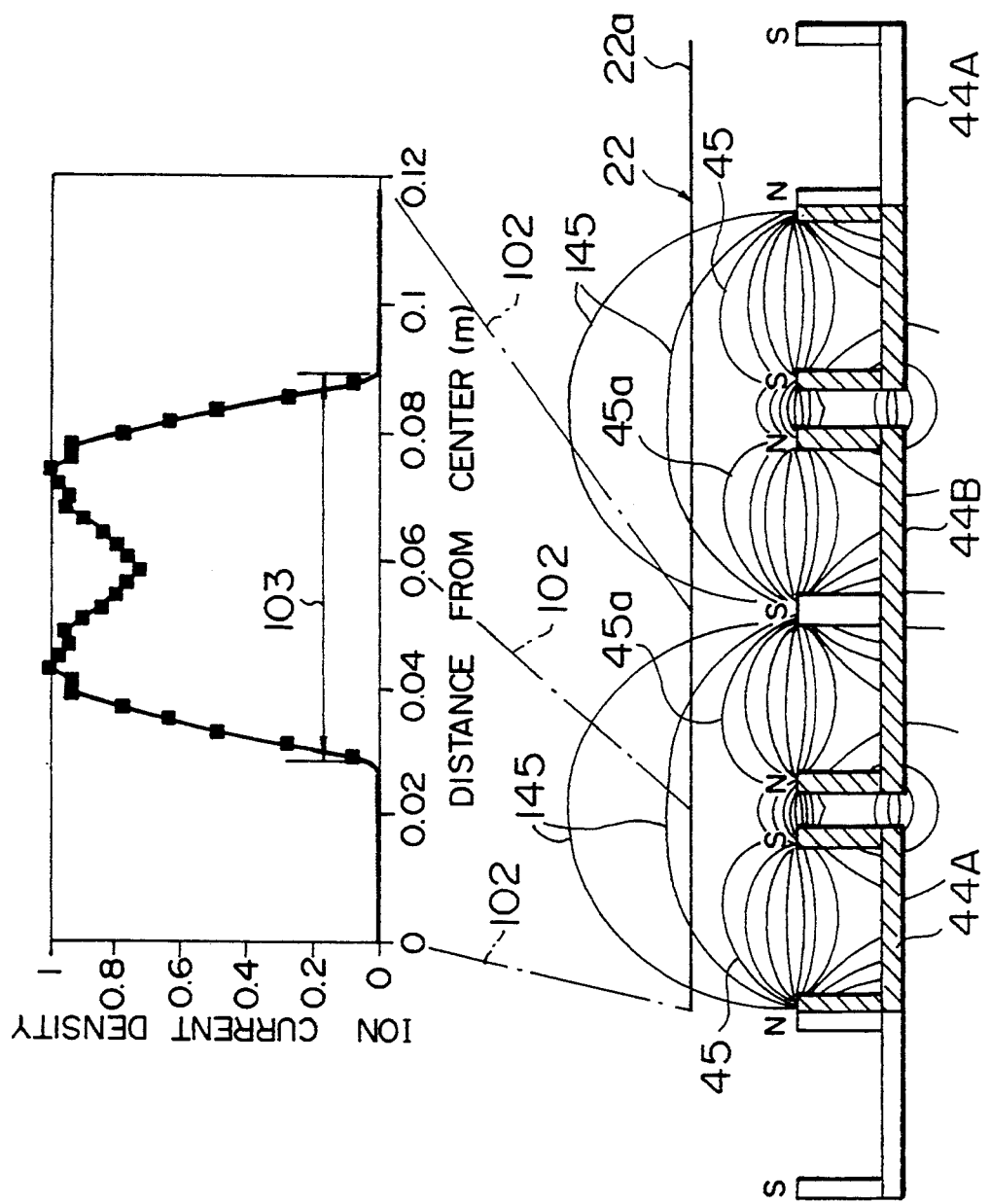
FIG. 13 illustrates the distribution of lines of magnetic force and a graph of the ion current density distribution above the target surface generated by the first and second magnet units when the first and second magnet units are disposed adjacent to each other.

In each of the loop loci, the drift direction of the two parallel longer side portions is the same as the drift direction of the longer side portions of the adjacent loop loci. The shunt spacer 49 is made of soft iron having a large magnetic permeability. It may also be made of a silicon steel plate in which 3.5% of silicon is added to iron, Permalloy (which is an alloy of iron and nickel), Perminvar (which is an alloy of iron, nickel, and cobalt) and to which rolling and heat treatment are applied, Isoparm (which is an alloy of iron, nickel and copper), or Sendust (which is a dust core). The shunt spacer 49 has the function of reducing interference between the two magnet units located adjacent thereto which would occur when magnet units having opposite polarities are disposed close to each other. This means that the lines of magnetic force formed by the adjoining magnetic poles of the half portion of the magnet unit 44A and the half portion of the magnet unit 44B, i.e., the S pole of the magnet unit 44A and the N pole of the magnet unit 44B, are reduced, as shown in FIG. 13, which will be described in detail later. Thus, the ion current density distribution formed by the S pole of the magnet unit 44A and the N pole of the magnet unit 44B can be ignored as compared with the ion current density distributions formed by the half portions of the magnet units 44A and 44B separately. It will be seen in FIG. 13 that there is no influence of that ion current density distribution. If that ion current density distribution cannot be ignored, coupling of the ion current density distributions separately formed by the respective half portions of the magnet units 44A and 44B, which will be described later, will not exist. Provision of the shunt spacer 49 can decrease the spacing between the magnet units having different magnetic poles and thus keeps a stable magnetron plasma, and thereby cause the high usage efficiency of the target.

Distribution of the lines of magnetic force, the locus of the motion of the drift electrons, and the eroded area of the target in the magnet assembly 32 in which the magnet units 44A and 44B are alternately disposed with the shunt spacer 49 between the adjacent magnet units will be described below with reference to FIG. 13. In FIG. 13, only three magnet units of five total are shown. The dimensions of the magnet units shown in FIG. 13 are the same as those described in connection with FIG. 7. The interval between the two magnet units 44 is about 1 cm. Lines of magnetic force 145 are synthesized lines of magnetic force between the magnet unit 44B located at the center and the half portions of the magnet units 44A located adjacent to the magnet unit 44B.

The upper graph in FIG. 13 shows ion current density distribution above the target surface obtained by the lower structure. The distance represented by the abscissa of the graph showing the ion current density distribution and the distance in the widthwise direction of the magnet units have a relationship as indicated by alternate long and short dash lines 102. Since ions are generated as a consequence of bombardment of the drift electrons with the gas molecules, the ion current density distribution shown in FIG. 13 can be regarded as a projection of the space density distribution of the drift electrons which travel the space above the target surface onto the target surface. The loop locus of the drift electrons is not a single line but a region having a certain width. As can be seen in FIG. 13, on the adjoining drift electron orbits of the two loop loci in which the directions of the movement differ from each other, two discoupled areas having respectively a width "b" (FIG. 14) are not formed, but a space 103 is formed, which is a single wider area having two ion current density maximum values and obtained by coupling the two ion current generation areas. That is, the entire space 103 is an ion current generation area. The reason why such a single space 103 having a wider area is formed is that the orbits of the drift electrons generated by the adjacent two magnet units 44A and 44B are hybridized to form a single orbit due to the interaction between the two adjacent magnet units 44A and 44B. The reason why the hybrid orbit is formed is considered that the drift electrons which move in the same direction do not repel each other but hybridize the adjoining orbits. The orbit formed by hybridization of the two drift electron orbits is defined as a "hybrid orbit", which is quite different from that generally used in the quantum chemistry field.

Turning again to FIG. 12, 104 and 105 denote the adjoining drift electron orbits formed by the magnet units 44A and 44B, respectively. The hatched region represents the single space 103 having a wider area and formed by the drift electron orbits 104 and 105. The space 103 is the ion current generation area corresponding to the hybrid orbit formed by the drift electron orbits 104 and 105. The width of the ion current generation area by the drift electron orbits formed by the single magnet unit 44A or 44B is as shown in FIG. 7.

Figure 14:
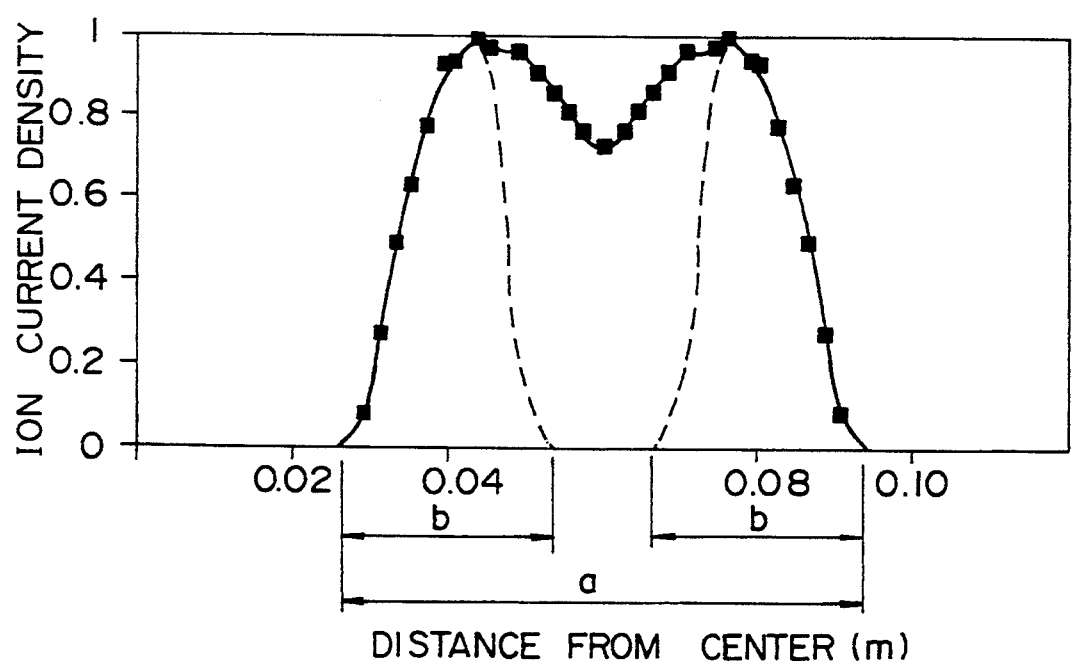
FIG. 14 is a graph showing both the ion current density distribution above the target surface generated when the first and second magnet units are disposed adjacent to each other and that generated by the first and second magnet units located separately.

A width 'a' of the ion current generation region due to the hybrid orbit is much larger than the sum of widths 'b' of the ion current generation regions due to the drift electron orbits which form the hybrid orbit, as shown in FIG. 14. As mentioned above in connection with FIG. 7, the width of the ion current generation region of the drift electron orbit formed by the single magnet unit is about 2.1 cm. The width of the ion current generation region by the hybrid orbit is about 6.3 cm. This means that the ion current generation region due to the hybrid orbit is not the algebric sum of the ion current generation regions due to the individual drift electron orbits. That is, the drift electrons which move in the same direction on the two orbits form the hybrid orbit and distributions of the ion current generation regions of the two drift electron orbits are thus coupled to each other. Thus, the ion current generation region by the hybrid orbit is larger than the sum of the two ion current generation regions.

Although not shown in FIG. 13, ion current density distribution having a specular symmetrical form with respect to the ion current density distribution shown in FIG. 13 is formed on the opposite region of the magnet unit 44A which adjoins the other magnet units. Although not shown in FIG. 13, distribution having a specular symmetrical form with respect to the ion current density distribution is similarly formed on the opposite region of the magnet unit 44A.

Figure 15:
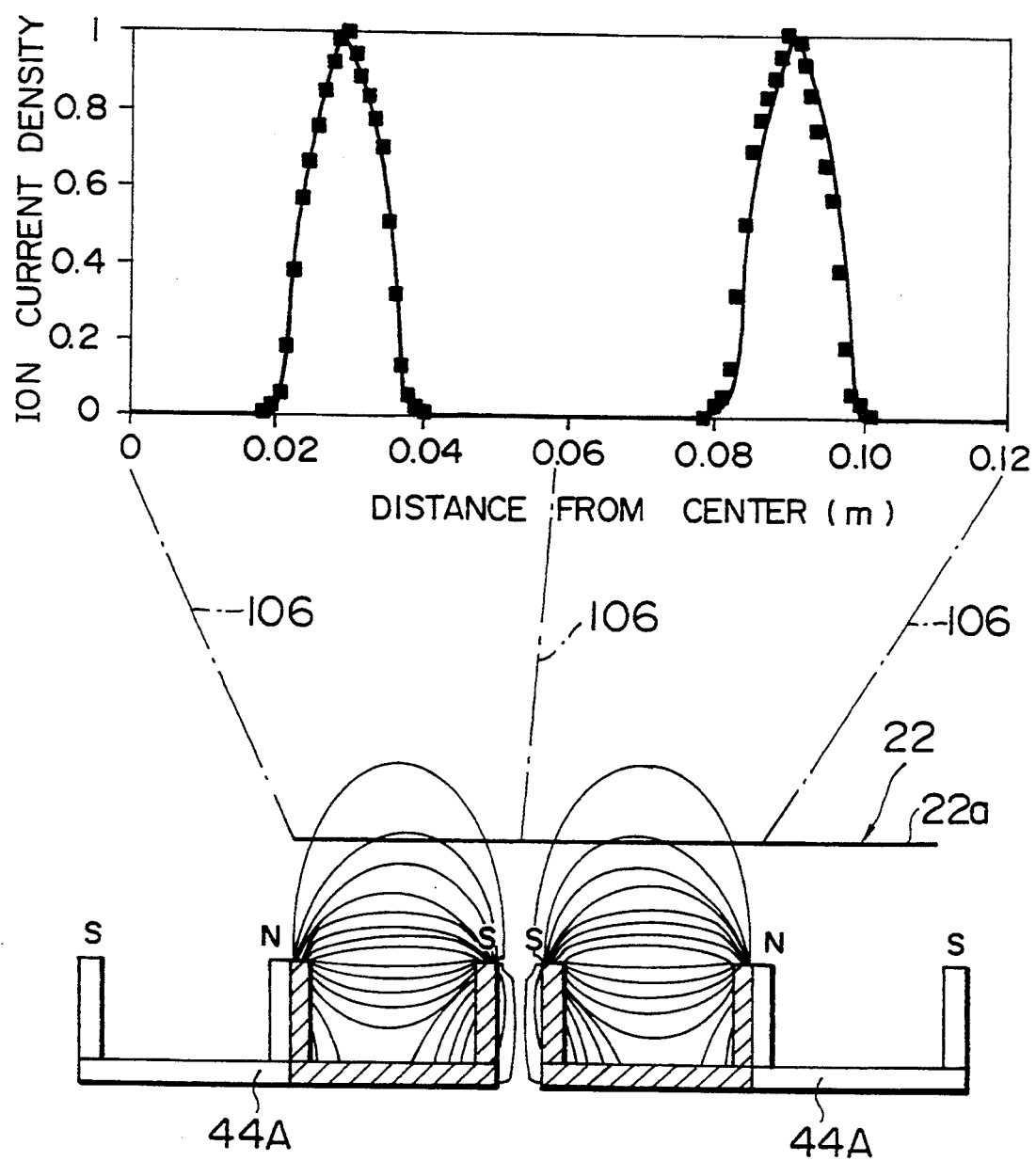
FIG. 15 illustrates the distribution of the lines of magnetic force and a graph showing ion current distribution above the target surface generated when the two first magnet units are disposed adjacent to each other.

The advantage of the alternate layout of the magnet units whose magnetic poles are opposite will be described below with reference to FIG. 15. The lower figure in FIG. 15 shows the distribution of the lines of magnetic force when the two magnet units 44A whose magnet poles are directed in the same direction are disposed adjacent to each other. The upper figure in FIG. 15 shows the ion current density formed by those lines of magnetic force. The two figures in FIG. 15 have a positional relationship indicated by alternate long and short dash lines 106. In the structure in which a plurality of magnet units 44A whose magnetic poles are the same are disposed, the drift electron orbits form two spaces separated from each other, as shown in FIG. 15. The width of the ion current generated region by each of the two orbits shown in FIG. 15 is about 1.9 cm. This width is slightly narrower than that shown in FIG. 7. The reason therefor is that the adjacent drift electrons move in the opposite directions and thus repel each other.

In this embodiment, the surface of the target of the cathode 20 has a relatively large rectangular area. On the target surface, the portions to be sputtered are defined as the belt-like portions of the loop loci formed by the lines of magnetic force of the magnet units 44A and 44B. Since the hybrid orbit is formed on the target surface by alternately disposing the magnet units 44A and 44B whose magnetic poles are disposed in the manner described above, the loop loci can be formed over a wide area, and the usage efficiency of the target having a relatively large area (which is defined by the ratio of the loop locus area to the overall area of the target) can thus be increased.

More specifically, in the conventional target surface, since the loop locus to be sputtered is narrow and isolated, only the loop locus portion is eroded, forming a groove, and causing the portion to be sputtered unevenly distributed. However, in this embodiment, since the hybrid orbit is formed by disposing the loop loci formed on the target in alternate directions so that the adjoining two locus portions are directed in the same direction and by disposing the adjacent loop loci 46 and 46a close to each other, the width of the adjacent portions of the loop loci is increased, increasing the area of the locus portion and hence increasing the usage efficiency of the target. The usage efficiency of the target may be increased to about 30%.

As mentioned above, the loop locus of the drift electrons is formed on the target surface by the interaction between the electric field and the magnetic field generated by both the central magnet and the peripheral magnet. The required magnetic field is, for example, between 200 and 500 gauss in terms of the magnetic component parallel to the target surface.

A second embodiment of the magnetron cathode according to the present invention will be described below with reference to FIGS. 16 through 19.

In the cathode configuration of this embodiment, the structure of and relative positional relationship between the electrode housing, the target assembly, the wall portion and open portion of the sputtering chamber, the plurality of O rings for maintaining air tightness, and the shielding members are the same as those of the cathode of the previous embodiment which has been described in connection with FIG. 2. Identical reference numerals in these figures to those in FIG. 2 represent similar or identical elements, and description thereof is omitted. The feature of this embodiment lies in the structure of the magnet assembly. The structure of that magnet assembly will now be described in detail.

A magnet assembly 51 includes four magnet units. Practically, two each of magnet units 44A and magnet units 44B are alternately disposed in the magnet assembly 51. The shunt spacer 49 is disposed between the adjacent magnet units. Since there are four magnet units in total in the magnet assembly 51 of this embodiment, accommodation of the four magnet units in the recessed space 38 of the electrode housing 31 leaves a space 52 having a width substantially the same as that of the single magnet unit, enabling the magnet assembly 51 to be moved backward and forward in the direction indicated by an arrow 53 or 54 within the recessed space 38 of the electrode housing 31. The stroke of the reciprocative movement of the magnet assembly 51 is substantially equal to the width of a single magnet unit. The magnet assembly 51 of this embodiment is provided with a moving mechanism.

Figure 16:
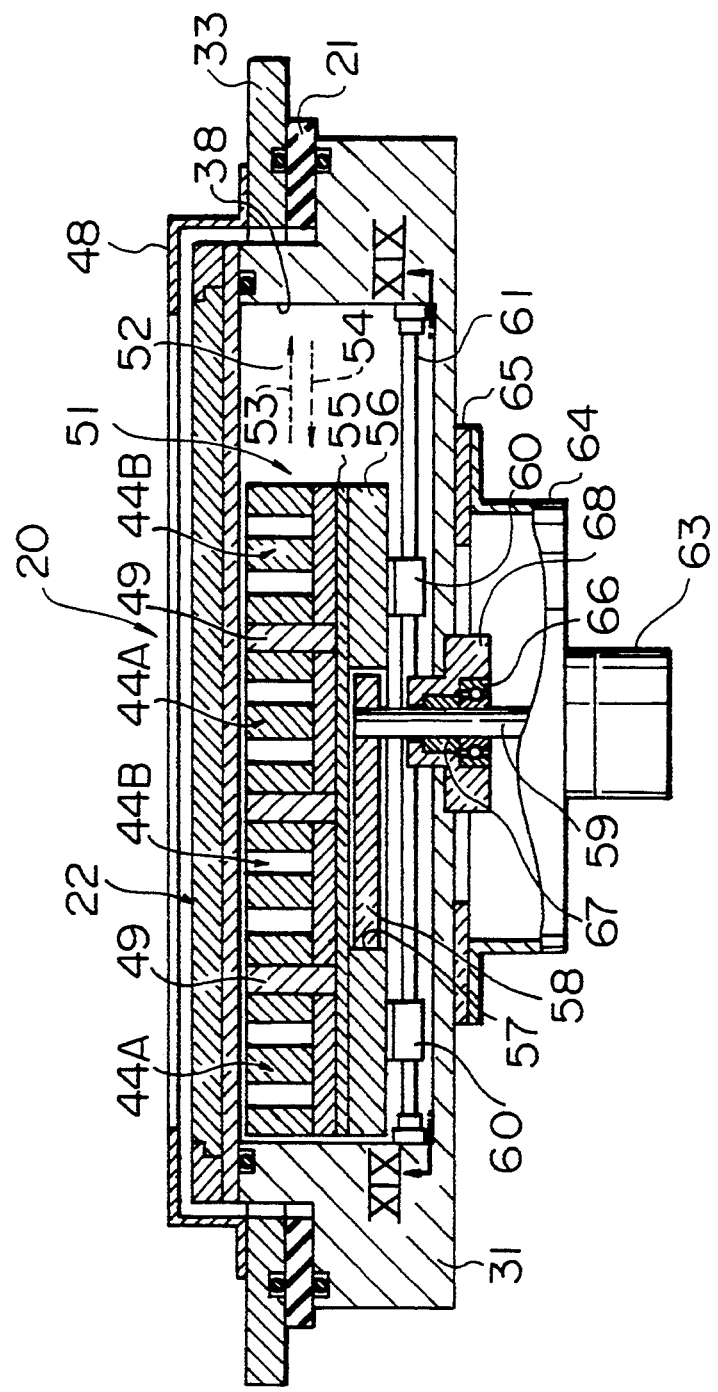
FIG. 16 is a cross-sectional view of a second embodiment of the magnetron cathode according to the present invention.
Figure 19:
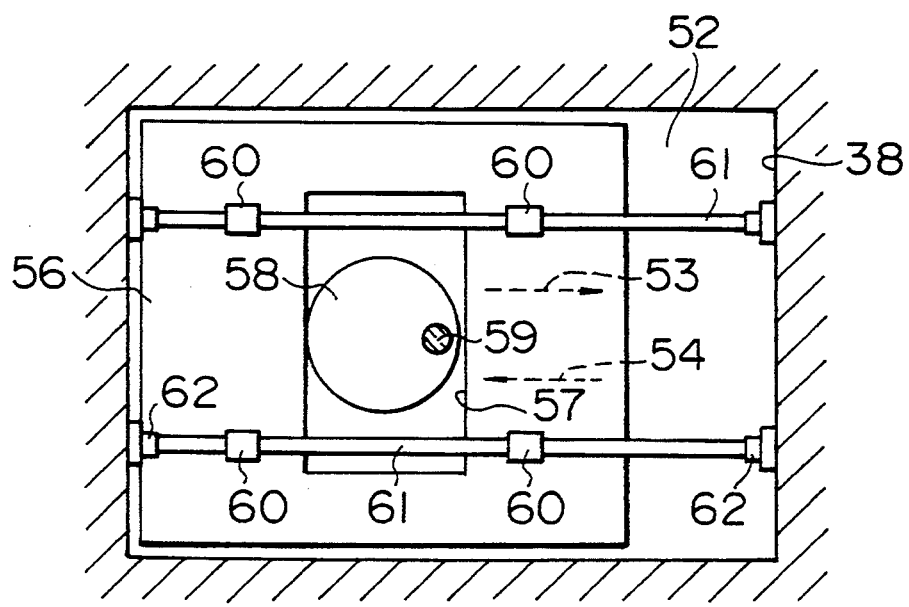
FIG. 19 is a section taken along the line XIX—XIX of FIG. 16.

The moving mechanism will be described below with reference to FIGS. 16 and 19. FIG. 19 is a section taken along line XIX—XIX of FIG. 16.

Reference numeral 55 denotes a support base for supporting the magnet assembly 51. The magnet assembly 51 is fixed to the support base 55 by means of screws or the like which are not shown. The support base 55 is fixed to a driving plate 56. The driving plate 56 has, for example, a rectangular guide hole 57 at a central portion thereof. In the guide hole 57, a circular cam 58 is disposed in such a manner that it is in contact with part of the inner wall. The cam 58 is rotated by a cam shaft 59. The shape of the cam 58 is not limited to the circular one.

Four slide bearings 60 are fixed to the bottom portion of the driving plate 56. Near the bottom portion of the recessed space 38, for example, two guide bars 61 are disposed in the longitudinal direction thereof. The slide bearings 60 are fitted onto the guide bars 61. The two ends of each of the guide bars 61 are fixed to receiving portions 62 provided on the inner wall surface of the recessed space 38 in the electrode housing 31.

In such a structure, the driving plate 56 is movable along the guide bars 61 in a direction indicated by the arrow 53 or 54. As the cam shaft 59 is rotated, the driving plate 56 reciprocates within the recessed space 38 in accordance with the contact relation between the cam 58 and the guide hole 57. When both the cam 58 and the guide hole 57 are circular and the rotational speed of the cam shift 59 is constant, the reciprocating motion of the driving plate 56 is a simple harmonic motion whose speed is slow at the two end position of a stroke and is fast at the central position thereof.

The shape of the guide hole 57 is not limited to the rectangular one. A guide hole 57 having an elliptical or any other similar form may also be employed as long as it enables the driving plate 56 to be reciprocated by the rotational operation of the cam 58.

The cam shaft 59 is coupled to a driving shaft of a motor 63 so that it can be rotated by the motor 63. The motor 63 is disposed outside the electrode housing 31 and is fixed to the electrode housing 31 by a support frame 64 and a support base 65. The cam shaft 59 is fixed by a shaft cylinder 68 into which both a radial bearing 66 for supporting the cam shaft while allowing it to be rotated smoothly and an oil seal 67 for sealing cooling water in the electrode housing while rotating are fitted.

Figure 17:
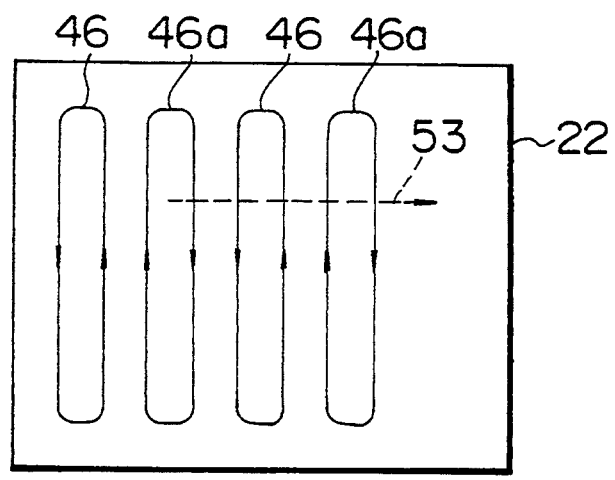
FIG. 17 illustrates a first movement state of the loop loci on the target surface by the magnetron cathode electrode in the second embodiment.
Figure 18:
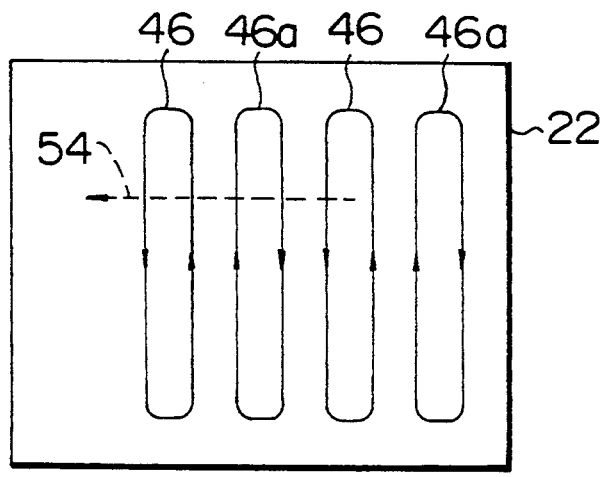
FIG. 18 illustrates a second movement state of the loop loci on the target surface by the magnetron cathode in the second embodiment.

In the aforementioned structure, when the cam shaft 59 is rotated In the fixed direction by the rotation of the motor 63, the magnet assembly 51 reciprocates within the recessed space 38 in the electrode housing 31. FIG. 17 shows the loop locus of the drift motion electrons, formed on the target surface when the magnet assembly 51 is located at the left end of the stroke. The loop loci corresponding to the magnet units 44A and 44B, which are directed in opposite directions, are disposed alternately. In that state, the loop loci move in the direction indicated by the arrow 53 as the magnet assembly 51 moves. FIG. 18 shows the loop loci of the drift electrons, formed on the target surface when the magnet assembly 51 is located at the right end of the stroke. In the aforementioned state of the loop loci, the loop loci move in the direction indicated by the arrow 54 as the magnet assembly 51 moves. Thus, the four loop loci move as a consequence of the movement of the magnet assembly 51. At that time, since the directions of the adjacent loop loci are opposite to each other, the directions of the electron motion on the adjacent two path portions in the adjacent two loop loci are the same.

Because the plurality of loop loci of the drift electrons on the target surface move cyclically, the target can be uniformly eroded except for the two end portions thereof, and the usage efficiency of the target can thus be further increased. Particularly, when the stroke of the reciprocating motion of the entire magnet assembly is equal to the width of the magnet unit, the average deposition rate can be increased while the same substrate film thickness distribution and target usage efficiency as those when the single magnet unit is reciprocated are maintained, thus improving the uniformity of the film quality in the substrate.

In the above-mentioned embodiments, the most desirable form, dimensions, material and number of the individual components have been described. However, they are not restrictive. Furthermore, the central magnet and the peripheral magnet, which constitute the magnet unit in the respective embodiments, have the same dimensions and are made of the same material. The only difference between them is the position of the magnetic poles thereof. To achieve uniformity of the target usage efficiency and film thickness distribution on the substrate, the dimensions and material of a magnet unit may be different from those of another magnet unit. Even in such a case, the magnet units whose combinations of magnetic poles are opposite are alternately disposed close to each other.

Figure 20:
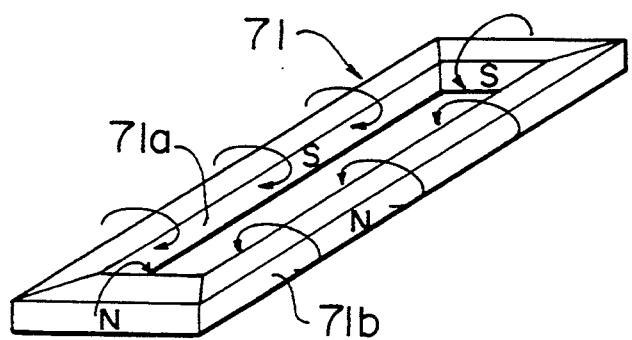
FIG. 20 is an external perspective view of another example of the magnet used as the first magnet unit.
Figure 21:
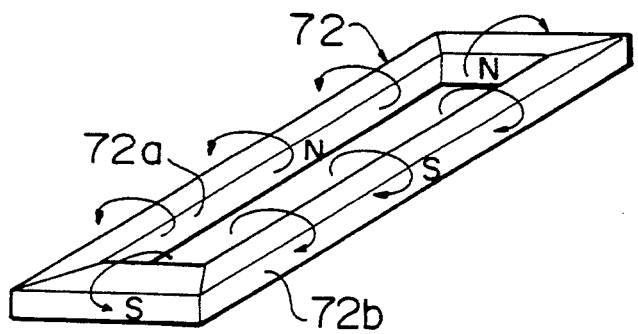
FIG. 21 is an external perspective view of still another example of the magnet used as the second magnet unit.
Figure 22:
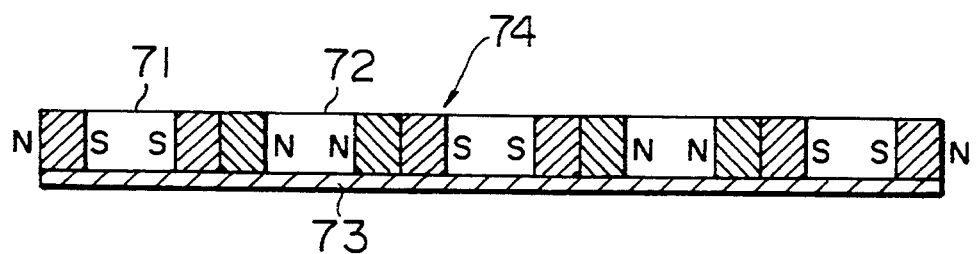
FIG. 22 is a cross-sectional view of a magnet assembly constructed using the magnets shown in FIGS. 20 and 21.

The magnets provided in the magnet unit may be constructed such that magnetic pole surfaces 71a, 71b, 72a and 72b of magnets 71 and 72 are perpendicular to the target surface when they are disposed in the electrode housing 31, as shown in, for example, FIG. 20 or 21. In that case, provision of the aforementioned central magnet is eliminated. FIG. 22 illustrates an example of a magnet assembly 74 in which the magnet units 71 and 72 shown in FIGS. 20 and 21 are disposed alternately on a support plate 73, or five magnet units thereon. In this structure, provision of the shunt spacer for reducing the interaction between the adjacent magnetic poles is eliminated. Thus, the magnet assembly can be accommodated in the electrode housing very effectively, and the overall size thereof can further be reduced.

Figure 23:
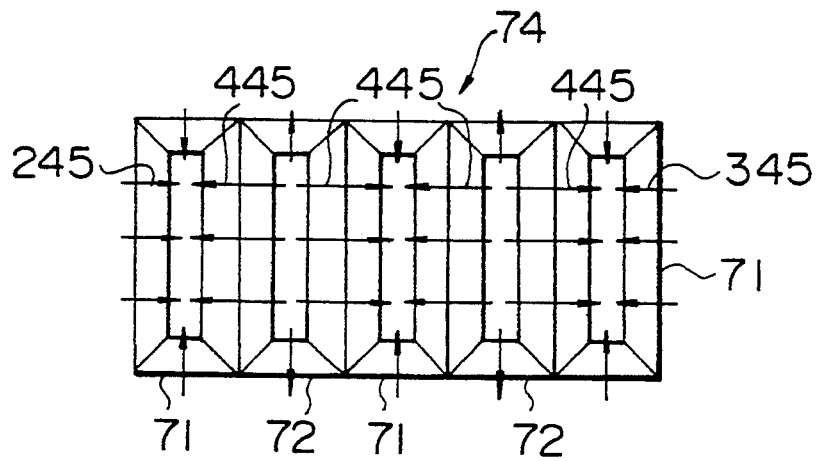
FIG. 23 is a plan view of the magnet assembly shown in FIG. 22.
Figure 24:
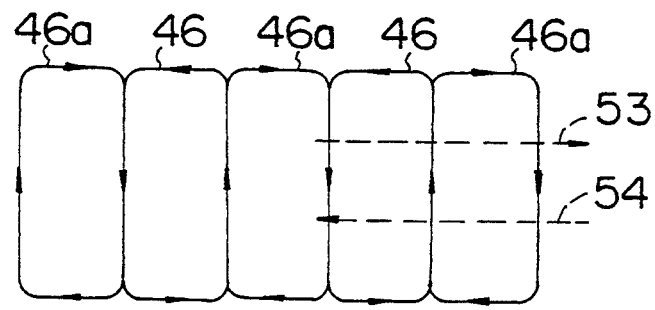
FIG. 24 illustrates the loop loci of the drift electrons formed by the magnet assembly shown in FIG. 22.

FIG. 23 is a plan view of the magnet assembly 74 shown in FIG. 22. In FIG. 23, the lines of magnetic force generated by the magnet units 71 and 72 are indicated by arrows. FIG. 24 illustrates the loci of the drift electrons of the magnet units 71 and 72 of the magnet assembly 74. Prior to the description in connection with FIGS. 23 and 24, the function of each of the magnet units 71 and 72 and that of the combination thereof will be explained.

Figure 25:
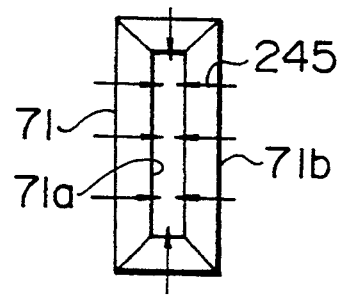
FIG. 25 is a plan view of the magnet shown in FIG. 20.
Figure 26:
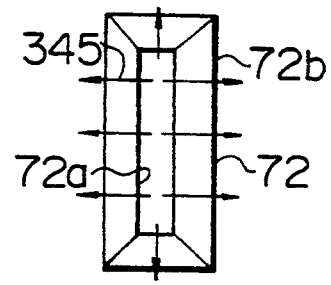
FIG. 26 is a plan view of the magnet shown in FIG. 21.
Figure 27:
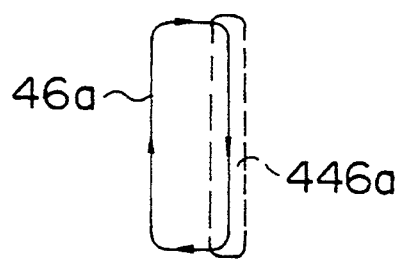
FIG. 27 illustrates the loop drift electron locus formed by the magnet shown in FIG. 25.
Figure 28:
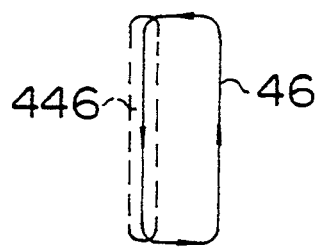
FIG. 28 illustrates the loop drift electron locus by the magnet shown in FIG. 26.

FIGS. 25 and 26 are respective plan views of the magnet units 71 and 72 shown in FIGS. 20 and 21. Reference numerals 245 denote the lines of magnetic force generated by the magnet unit 71, and 345 denote the lines of magnetic force generated by the magnet unit 72. FIGS. 27 and 28 show the loop loci of the drift electrons formed by the magnet units 71 and 72, respectively. The loop loci 46a and 46 shown in FIGS. 27 and 28 are the same as those shown in FIGS. 11 and 6.

Figure 29:
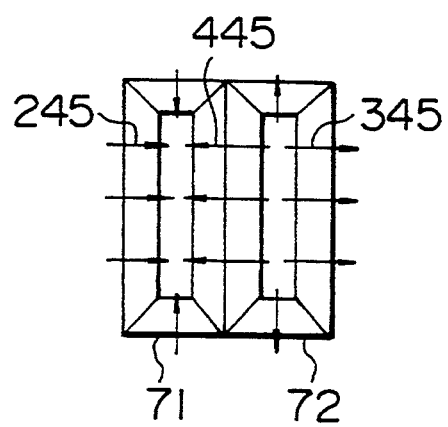
FIG. 29 is a plan view illustrating distribution of the lines of magnetic force generated when the magnets shown in FIGS. 25 and 26 are combined.
Figure 30:
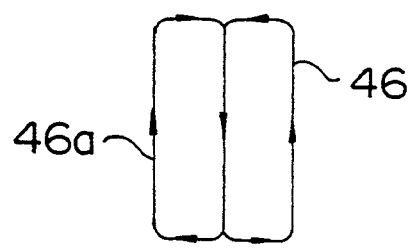
FIG. 30 illustrates a loop locus of the drift electrons which is formed when the magnets shown in FIGS. 25 and 26 are combined.

FIG. 29 illustrates a state in which the magnet units 71 and 72 shown in FIGS. 25 and 26 are combined with each other. In the combination shown in FIG. 29, lines of magnetic force 445 which cross the contact portion between the magnet units 71 and 72 are formed between the magnetic pole surface 72a (N pole) of the magnet unit 72 and the magnetic pole surface 71a (S pole) of the magnet unit 71. The lines of magnetic force 445 are those formed by synthesizing the lines of magnetic force 345 formed between the magnetic pole surface 72a (N, pole) and the magnetic pole surface 72b (S pole) of the magnet unit 72 with the lines of magnetic force 245 formed by the magnetic pole surface 71b (N pole) and the magnetic pole surface 71a (S pole) of the magnet unit 71. This means that the locus 46a of the drift electron motion by the lines of magnetic force 245 formed by the magnet unit 71 is superimposed with the locus 46 of the drift electron motion by the lines of magnetic force 345 formed by the magnet unit 72. That is, as shown in FIGS. 27 and 28, in the two types of loci 46 and 46a in which drift electron motions are directed in the opposite directions, drift electron orbits are hybridized with each other on portions 446 and 446a in which drift electron motions are directed in the same direction. In other words, a region where the two magnet units 71 and 72 have common lines of magnetic force is formed, i.e., a hybrid orbit is formed on the portion of the lines of magnetic force 445. Consequently, as shown in FIG. 30, the loop loci in which the drift electron motions are directed in the opposite directions are partially coupled, resulting in formation of a hybrid orbit.

FIGS. 23 and 24 will be explained from the above viewpoints. As mentioned above, in the magnet assembly 74, two types of magnet units 71 and 72 are disposed alternately. The portion of the lines of magnetic force 445 formed by the magnet unit 71 and the magnet unit 72 represents the portion where the drift electron loci are superimposed with each other. This superimposed portion forms the hybrid orbit. As shown in FIG. 24, the hybrid orbit is formed as the superimposed portion of the two loop loci 46 and 46a by the two magnet units 71 and 72 where the drift electron motions are directed in opposite directions. Hybrid orbits whose directions are opposite to each other are alternately formed by the superimposed portions of the plurality of pairs of loop loci 46 and 46a.

In this embodiment, it is possible to efficiently dispose the plurality of superimposed loop loci on the target surface of the magnet assembly 74. Furthermore, since in the superimposed portion of the loop loci the directions of the drift electron motions are the same, a hybrid orbit is formed by the hybridization of the drift electron orbits, and magnetron plasma can be generated stably and uniformly, as in the cases of the aforementioned embodiments.

This embodiment can incorporate a moving mechanism, as in the case of the second embodiment. By incorporating the moving mechanism shown in FIGS. 16 and 19, the magnet assembly 74 can be moved backward and forward in the direction 53 or 54. When the stroke of the reciprocating motion is equal to the width of the magnet unit, the region of the target where erosion takes place can be made uniform.

In this embodiment, it is possible to provide a uniform film thickness distribution on the substrate, increase the usage efficiency of the target, and increase the average deposition rate, as in the cases of the aforementioned embodiments. Furthermore, the film quality on the substrate can be made uniform.

In the magnetron cathode, in order to increase the width of the loop belt which is subjected to sputtering and thereby increase the target usage efficiency, a magnet assembly having a more complicated structure may be employed. In such a case, the structure of the present invention can be employed also. The moving mechanism for the magnet assembly in the embodiment described in connection with FIGS. 16 and 19 is a horizontal reciprocating motion mechanism which is accomplished by the cam and the guide hole. However, any other moving mechanism is applicable.

In the sputtering apparatus according to the present invention, a magnet assembly including a plurality of magnet units is provided in a single magnetron cathode having a rectangular planar large target. Two types of magnet units whose magnetic poles are opposite to each other are prepared, and these two types are alternately disposed adjacent to each other. Thus, the adjoining two drift electron orbits are hybridized to form a single hybrid orbit which serves as a wider ion current generating area, and the erosion area on the target surface can thus be enlarged.

Furthermore, since a moving mechanism is incorporated in the cathode to reciprocate the magnet assembly, the film forming process can be performed on a large rectangular substrate, and the size of the sputtering apparatus can be reduced. Furthermore, since the adjoining drift electron orbits are hybridized on the basis of the layout of the magnetic poles of the plurality of magnet units to form a single hybrid orbit, the usage efficiency of the target of the cathode is increased, and uneven distribution of the erosion regions is lessened while the erosion regions are enlarged. Consequently, the uniformity of the film thickness of the thin film formed on the substrate and homogeneity of the film quality can be improved and generation of dust particles on the target surface due to the deposited film can be suppressed.

What is claimed is:

1. A sputtering apparatus comprising a vacuum vessel having an evacuation system for evacuating said vacuum vessel, a substrate holding member disposed within said vacuum vessel for mounting a substrate on which a film is to be deposited, at least one magnetron cathode disposed in opposed relation to the substrate and having a rectangular planar target used to deposit the film on a surface of the substrate, a gas control system for supplying a gas in the interior of said vacuum vessel and thereby maintaining the inner pressure thereof at a predetermined value, and a power source system for supplying electrical power to said magnetron cathode, the improvement comprising;

a magnet assembly having a first magnet unit having at least a looped peripheral magnet with N and S poles arranged to form a first closed loop locus for drift electron motion in a first direction, said drift electron motion producing a first ion current generation region on a surface of said target when said drift electrons collide with said supplied gas in said first closed loop locus, a second magnet unit having at least a looped peripheral magnet with S and N poles arranged to form a second closed loop locus for drift electron motion in a second direction opposite said first direction, said drift electron motion producing a second ion current generation region on a surface of said target when said drift electrons collide with said supplied gas in said second closed loop locus, wherein said first magnet unit is disposed adjacent said second magnet unit with poles of opposite polarity adjacent each other such that said oppositely directed drift electron motions hybridize along said adjacent poles of opposite polarity, said adjacent poles of opposite polarity spaced such that any line of magnetic force formed between them does not interfere with said hybridization.

2. The sputtering apparatus of claim 1, wherein said adjacent poles of opposite polarity are spaced by a shunt spacer having a large magnetic permeability.

3. The sputtering apparatus of claim 1, wherein said adjacent poles of opposite polarity are directly adjacent each other with essentially no space between them.

4. The sputtering apparatus of claim 1, wherein a plurality of said first and second magnet units are positioned alternately in series to form plural hybridized ion current generation regions.

5. The sputtering apparatus of claim 1, wherein said first and second closed loop loci defining said first and second ion current generation regions have, individually, a width "b" defining the width of an erosion region on said target surface where said loci are not hybridized, and, wherein said first and second closed loop loci defining said first and second ion current generation regions have a combined width "a" greater than "2b" where said first and second ion current generation regions are hybridized.

6. The sputtering apparatus of claim 1, wherein said magnetron cathode has a moving mechanism for reciprocating said magnet assembly and wherein the ion current generation regions reciprocate as a consequence of the reciprocating motion of said magnet assembly by said moving mechanism.

7. The sputtering apparatus of claim 6, wherein said magnet assembly is disposed in a recessed space formed in an electrode housing of said magnetron cathode, said recessed space dimensioned such that said magnet assembly can move, said magnet assembly moving within said recessed space.

8. The sputtering apparatus of claim 1, wherein each of said first and second magnet units comprises a rectangular yoke, a central magnet disposed on said yoke, and a rectangular looped peripheral magnet on said yoke around said central magnet, each of said central magnet and said looped peripheral magnet having magnetic pole surfaces parallel to said target surface, the S pole of one of said first or second magnet units facing its yoke with the N pole facing said target, the N pole of the other of said first or second magnet units facing its yoke with its S pole facing said target.

9. The sputtering apparatus of claim 8, wherein said first and second magnet units are disposed close to each other, a spacer being provided between adjoining portions thereof.

10. The sputtering apparatus of claim 1, wherein each of said first and second magnet units comprises a yoke and a loop magnet disposed on said yoke, each said loop magnet having magnetic pole surfaces perpendicular to said target surface on an inner and outer peripheral surface thereof, one of said first or second magnet units having its S pole on its outer peripheral surface with its N pole on its inner peripheral surface, the other of said first or second magnet units having its N pole on its outer peripheral surface with its S pole on its inner peripheral surface.

11. The sputtering apparatus of claim 10, wherein opposite poles of said loop magnets of said first and second magnet units are in contact with each other.

12. The sputtering apparatus of claim 1, wherein said magnet assembly is disposed in a fixed state in a recessed space formed in an electrode housing of said magnetron cathode.

13. The sputtering apparatus of claim 1, wherein said substrate holding member is movable for conveying said substrate, said substrate holding member remaining at rest at a position where said substrate opposes the target surface of said magnetron cathode when a thin film is deposited on said substrate within said vacuum vessel.

14. The sputtering apparatus of claim 1, wherein said moving mechanism comprises a rotary driving device, a converting mechanism for converting a rotational motion of said rotary driving device into a reciprocating motion of said magnet assembly, and a guide member for guiding the reciprocating motion of said magnet assembly.

15. The sputtering apparatus of claim 1, wherein said drift electron motions of adjacent portions of said adjacent loci are directed in the same direction and parallel to each other.

* * * * *